United States Patent
Bertheau

(10) Patent No.: US 11,203,998 B2
(45) Date of Patent: Dec. 21, 2021

(54) ENGINE COMPRISING A MEASURING DEVICE FOR AN INTERNAL COMBUSTION ENGINE HAVING A TARGET PASSAGE DETECTOR

(71) Applicant: MCE 5 Development, Villeurbanne (FR)

(72) Inventor: René-Pierre Bertheau, Montagny (FR)

(73) Assignee: MCE 5 Development, Villeurbanne (FR)

( * ) Notice: Subject to any disclaimer, the term of this patent is extended or adjusted under 35 U.S.C. 154(b) by 0 days.

(21) Appl. No.: 16/616,896

(22) PCT Filed: May 25, 2018

(86) PCT No.: PCT/FR2018/051235
§ 371 (c)(1),
(2) Date: Nov. 25, 2019

(87) PCT Pub. No.: WO2018/220319
PCT Pub. Date: Dec. 6, 2018

(65) Prior Publication Data
US 2020/0173395 A1  Jun. 4, 2020

(30) Foreign Application Priority Data

May 29, 2017  (FR) ...................................... 1754683

(51) Int. Cl.
*F02F 7/00* (2006.01)
*F02D 35/02* (2006.01)
(Continued)

(52) U.S. Cl.
CPC ............ *F02F 7/0021* (2013.01); *F02D 35/02* (2013.01); *F16J 1/14* (2013.01); *G01R 33/07* (2013.01)

(58) Field of Classification Search
CPC ....... F02F 7/0021; F02F 7/0053; F02B 61/02; F02B 63/042; F02B 77/087; F02B 75/22;
(Continued)

(56) References Cited

U.S. PATENT DOCUMENTS 4,147,054 A * 4/1979 Hohenberg ........... F02B 77/087
73/114.28
4,632,018 A * 12/1986 Lymburner .......... F02B 77/087
73/37.6
(Continued)

FOREIGN PATENT DOCUMENTS

DE 4426501 C2 * 3/1998 ............... G01C 7/06
DE 4426501 C2   3/1998
(Continued)

OTHER PUBLICATIONS

International Search Report for International Application No. PCT/FR2018/051235 dated Aug. 3, 2018, 2 pages.
(Continued)

*Primary Examiner* — Jacob M Amick
*Assistant Examiner* — Charles J Brauch
(74) *Attorney, Agent, or Firm* — TraskBritt

(57) ABSTRACT

An internal combustion engine comprises a connecting rod and a target arranged on one of the lateral reinforcing walls of a piston or on a foot end of the connecting rod, and a crankcase defining at least one cylinder and having at least one bore opening out under the cylinder. The engine comprises a measuring device arranged in the bore of the crankcase and having a target passage detector, and a connector and at least one cable connecting the passage detector to the connector. The target is arranged opposite the passage detector, when the piston is near a bottom dead center position.

14 Claims, 3 Drawing Sheets

(51) Int. Cl.
*F16J 1/14* (2006.01)
*G01R 33/07* (2006.01)

(58) Field of Classification Search
CPC ...... F02D 41/009; G01M 15/06; G01D 5/245; G01D 5/2457; F16C 3/06; F16C 2360/22; F16C 41/007
See application file for complete search history.

(56) References Cited

U.S. PATENT DOCUMENTS

| | | | | |
|---|---|---|---|---|
| 5,299,490 | A * | 4/1994 | Harrer | F02F 3/02 123/193.6 |
| 6,810,722 | B2 * | 11/2004 | Jonsson | F02B 77/08 73/114.28 |
| 2012/0330534 | A1 * | 12/2012 | Cleeves | F02D 37/02 701/104 |
| 2014/0035563 | A1 * | 2/2014 | Tan | B29C 45/2806 324/207.2 |

FOREIGN PATENT DOCUMENTS

| | | |
|---|---|---|
| DE | 102015217152 A1 | 2/2017 |
| EP | 3087924 B1 | 6/2019 |
| WO | 2010/038102 A1 | 4/2010 |

OTHER PUBLICATIONS

International Written Opinion for International Application No. PCT/FR2018/051235 dated Aug. 3, 2018, 5 pages.
Decision to grant a European patent for European Application No. 18735653, dated Feb. 25, 2021, 2 pages.

* cited by examiner

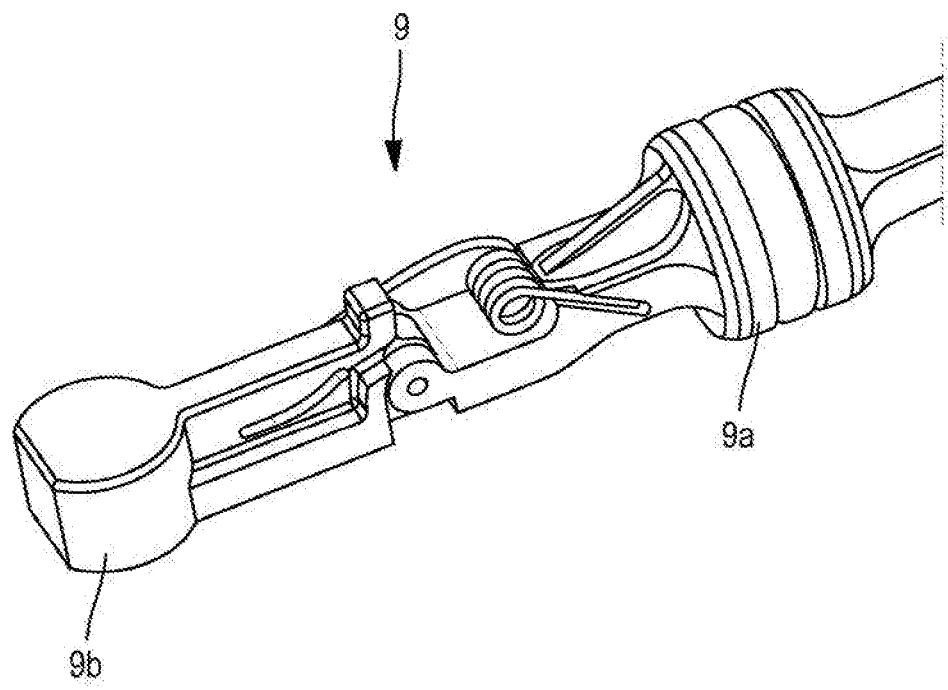
FIG. 5
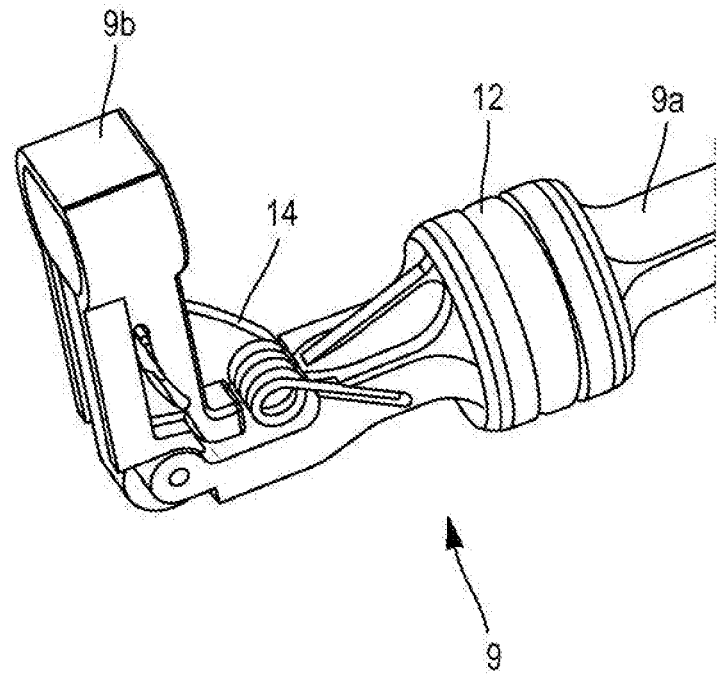

ENGINE COMPRISING A MEASURING DEVICE FOR AN INTERNAL COMBUSTION ENGINE HAVING A TARGET PASSAGE DETECTOR

CROSS-REFERENCE TO RELATED APPLICATIONS

This application is a national phase entry under 35 U.S.C. § 371 of International Patent Application PCT/FR2018/051235, filed May 25, 2018, designating the United States of America and published as International Patent Publication WO 2018/220319 A1 on Dec. 6, 2018, which claims the benefit under Article 8 of the Patent Cooperation Treaty to French Patent Application Serial No. 17/54683, filed May 29, 2017.

TECHNICAL FIELD

The present disclosure relates to a measuring device comprising a sensor for detecting the passage of a target carried by a piston of an internal combustion engine. This type of device can be used in the field of engines with variable compression ratios.

BACKGROUND

As a foreword, it is noted that an internal combustion engine generally includes a combustion piston with a skirt to guide the piston in the cylinder, a connecting rod associated on its foot side with the piston pin and on its head side with a crankshaft bearing. These two bearings generally have parallel axes. The function of the rod is to transmit the translational movement of the piston from a "top dead center" to a "bottom dead center" as the crankshaft rotates.

It is generally agreed that adapting the compression rate of an engine to its load enables a great increase in the engine fuel efficiency. For example, it is sometimes desired to vary the compression ratio between a value of about 12 in the absence of load to a value of about 8 at full load.

It should also be noted that the compression ratio of an internal combustion engine, often referred to as the compression rate, corresponds to the ratio of the volume of the combustion chamber when the piston is at the bottom dead center to the volume of the combustion chamber when the piston is at its top dead center.

Several solutions for adjusting the compression ratio and/or displacement of an internal combustion engine are known in the state of the art.

Whatever the solution implemented to allow this adjustment, it is often necessary to have the most direct possible measurement of the compression ratio, for example within a computer, to effectively control the engine. This information can be used, for example, to determine the precise time, or the angular offset, at which the spark plug in the engine combustion chamber must be turned on.

Solutions are therefore known that use a contactless position sensor, the sensor being fixedly placed on the cylinder housing and identifying the proximity of a target fixedly placed on the piston or the connecting rod. It can be a Hall effect sensor, in which case the target includes a magnetic element or a metallic mass. The signal emitted by the sensor can be analyzed, and its maximum indicates the time at which the target is positioned closest to the sensor. A numerical model or pre-established tables can be used to determine the compression ratio by combining, for example, the information provided by the sensor with the angular position of the crankshaft.

The space defined by the cylinder housing in which different moving parts (crankshaft, pistons, connecting rods, etc.) are in motion is particularly limited. The additional elements that are placed in this volume (target, sensor, etc.) must be precisely arranged and configured so as to not interfere with the operation of the engine, while ensuring their functions with great reliability. In particular, the integration of additional elements that would modify the geometry of the cylinders and/or any machining that could damage a liner that can be fitted to these cylinders is to be avoided.

BRIEF SUMMARY

To One of the objects of the present disclosure is to provide an internal combustion engine comprising:
  a connecting rod having a foot and a piston associated with the connecting rod foot, the piston comprising two skirt portions, two reinforcing side walls connecting the two skirt portions together;
  a target placed on one of the side walls or on the connecting rod foot;
  a cylinder housing defining at least one cylinder and having at least one bore opening under the cylinder;
  a measuring device placed in the bore of the crankcase and comprising a target passage sensor, a connector and at least one cable connecting the passage sensor to the connector, a first part supporting the connector, a second part supporting the passage sensor, the first part and the second part being articulated to one another.

The target is positioned opposite the passage sensor when the piston is near a low neutral position.

According to other advantageous and non-limiting characteristics of the present disclosure, taken alone or in any technically feasible combination:
  the first part of the measuring device is fully inserted into the cylinder housing;
  the bore is perpendicular to a crankshaft axis of the engine;
  the passage sensor is a Hall effect sensor;
  the engine has a variable compression ratio;
  the piston walls are provided with reinforced bosses to retain a piston pin, and in which the target can be placed on one of the reinforced bosses;
  the target is located near the bottom of the connecting rod;
  the target is a magnetic or metallic body.

BRIEF DESCRIPTION OF THE DRAWINGS

Other characteristics and advantages of the present disclosure will emerge from the detailed description of the present disclosure that follows with reference to the appended figures wherein:
FIG. 5 shows a measuring device with a return element.

DETAILED DESCRIPTION

Figure 1A:
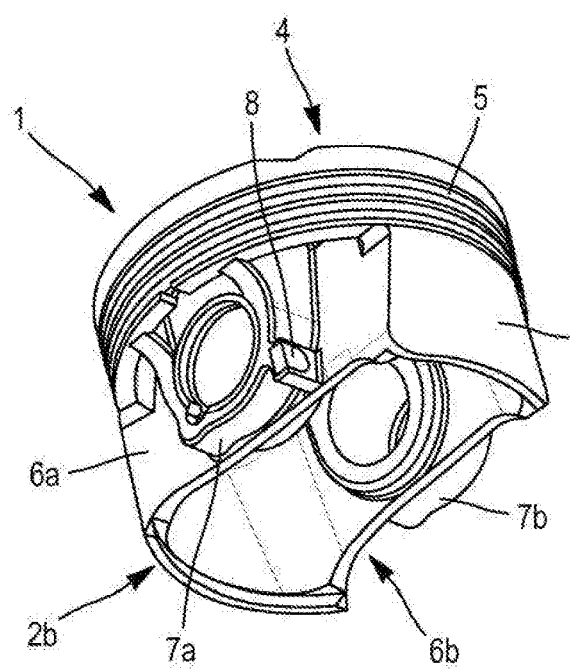
FIGS. 1a and 1b respectively illustrate a piston of an internal combustion engine according to two embodiments of the present disclosure.
Figure 1B:
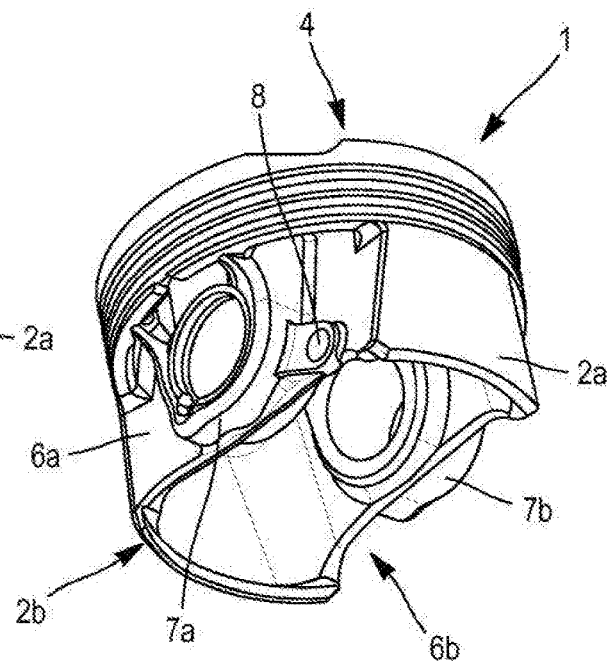

FIGS. 1a and 1b respectively illustrate a piston 1 of an internal combustion engine according to two embodiments according to the present disclosure. Piston 1 is equipped with skirt portions 2a, 2b to guide the piston 1 in a cylinder 3 defined by a cylinder housing. In a very conventional way, the skirt 2 is connected to the cap 4 of the piston 1 and carries grooves 5 to receive rings. Skirt 2 is composed of two portions 2a, 2b whose cross-section is in the shape of a circle portion. The two skirt portions 2a, 2b are connected to each other via two side walls 6a, 6b. These two side walls 6a, 6b are equipped with reinforced bosses 7a, 7b to receive a piston pin, and associate the piston 1 with a foot of a connecting rod.

A target 8 is placed on one of the two side walls 6a, 6b in order to avoid the target 8 interfering with the movement of piston 1. The target 8 may include a metallic and/or magnetic body, or, in general, may be made of any material whose passage in the vicinity of a passage sensor located in the engine can be identified.

Preferably, target 8 is placed on the lower part of one of the side walls 6a, 6b of piston 1, i.e., opposite to cap 4. The target 8 can be placed on either the intake or exhaust side of piston 1. For example, and as shown in FIG. 1a, target 8 can be carried by one of the reinforced bosses 7a, 7b, or, as shown in FIG. 1b, target 8 can be carried on a reinforcement rib of one of the side walls 6a, 6b.

In an alternative not shown, the target can be placed on the connecting rod, preferably in the vicinity of the connecting rod foot.

Figure 2:
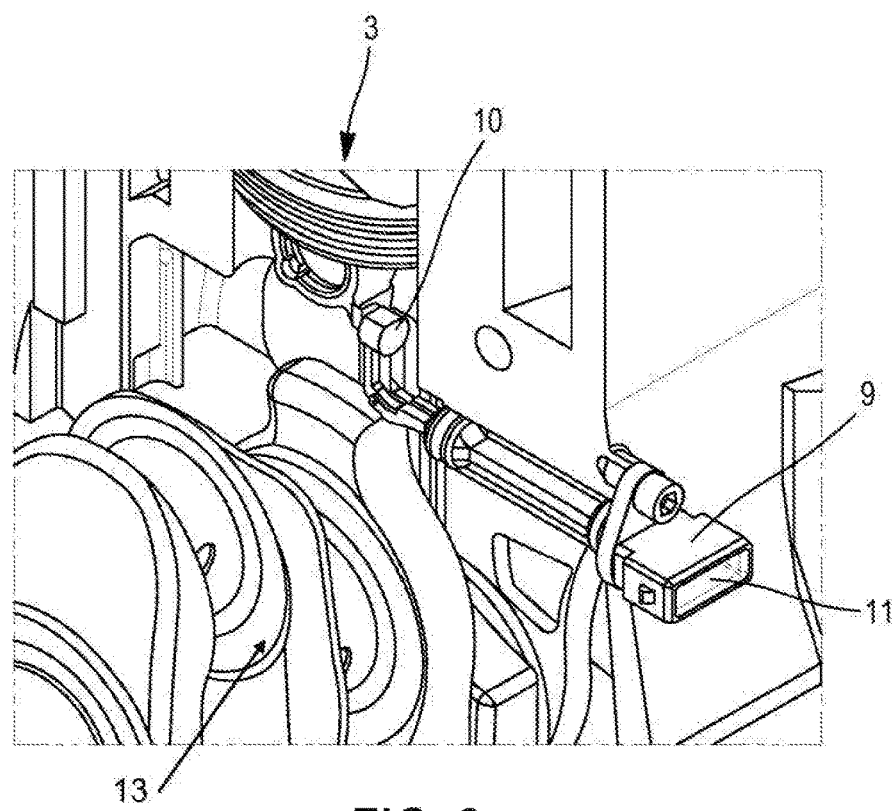
FIG. 2 shows an internal combustion engine including a piston according to the present disclosure.

FIG. 2 shows an internal combustion engine with a piston 1 as described above. The piston is placed in a cylinder 3 defined by the cylinder housing. The cylinder housing has a bore opening under cylinder 3. This bore is dimensioned to receive a measuring device 9 comprising, at one end intended to be placed inside the engine block, a passage sensor 10. The passage sensor can be, for example, a Hall effect sensor, configured to detect the passage of the target 8. When in the correct operating position in the bore, the measuring device 9 is positioned opposite target 8, when the piston 1 is in or near the bottom dead center position.

In the configuration shown in FIG. 2, the bore does not open directly into cylinder 3, which would have been necessary if the measuring device 9 had not been articulated. Indeed, such a configuration is likely to damage the inner surface of cylinder 3 and affect the engine performance, especially when cylinder 3 has a liner integrated or inserted upon casting.

In addition, this configuration makes it possible to obtain a very direct, and therefore accurate, measurement of the position of piston 1 without interfering with the operation of the engine, which would have been more difficult to obtain by having the target 8 supported by a connecting rod.

Advantageously, to facilitate its machining, the bore formed in the cylinder housing is perpendicular to the crankshaft main axis 13.

Measurement device 9, as seen above, includes a passage sensor 10 for target 8. The measurement device 9 also includes at least one connection cable, connecting the sensor 10 to a connector 11. The cable and connector 10 are used to communicate the passage detection measurement to a computer.

Figure 3A:
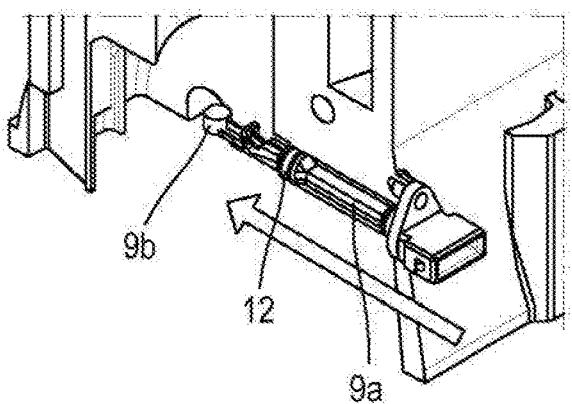
FIGS. 3a and 3b represent the measuring device during its insertion into the engine block and in its operating position, respectively.
Figure 3B:
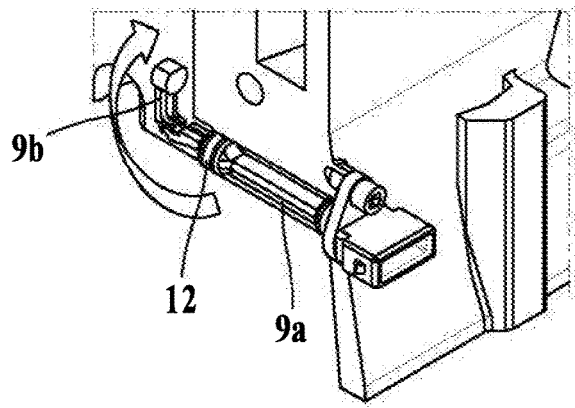

To enable target 8 to be placed in front of the passage sensor 10, when the piston is in the bottom dead center position, the measuring device 9 is composed of two parts 9a, 9b articulated to one another. FIGS. 3a and 3b show the measuring device 9 during its insertion into the engine block and in its operating position, respectively.

The first part 9a supports connector 11 at its free end. The first part 9a is of sufficient length so that, when the measuring device 9 is placed in the bore of the crankcase, the second part 9b is placed entirely within the space defined by the engine block. The second part 9b supports the passage sensor 10 at its free end. Both parts 9a, 9b can be hollow so that the cable can extend between sensor 10 and the connector 11.

The measuring device 9 is selectively configurable in an insertion position in which the first part 9a and the second part 9b are aligned with each other. This configuration, shown in FIG. 3a, allows the measuring device 9 to be inserted into the bore of the crankcase and placed in its operating position.

The measuring device 9 is also selectively configurable in an operating position in which the first part 9a and the second part 9b are not aligned with each other. Thus, in the operating configuration, the first part 9a and the second part 9b may, for example, have an angle of 90° between them, as shown in FIGS. 2 and 3b. Whatever this angle, the articulation between the first part 9a and the second part 9b allows the measuring device 9 to be placed in the operating position in which the sensor 10 is placed opposite target 8, when piston 1 is in or near its bottom dead center position.

The measuring device 9 can be fitted with a sealing part 12, cooperating with the bore of the crankcase to prevent engine oil from leaking out of the engine block.

Advantageously, the measuring device 9 can include a locking element, which allows the measuring device 9 to be firmly held in the operating position. It can be a clip, or a strut. The locking element can be manually inserted when positioning the measuring device 9 in the cylinder housing.

Figure 4:
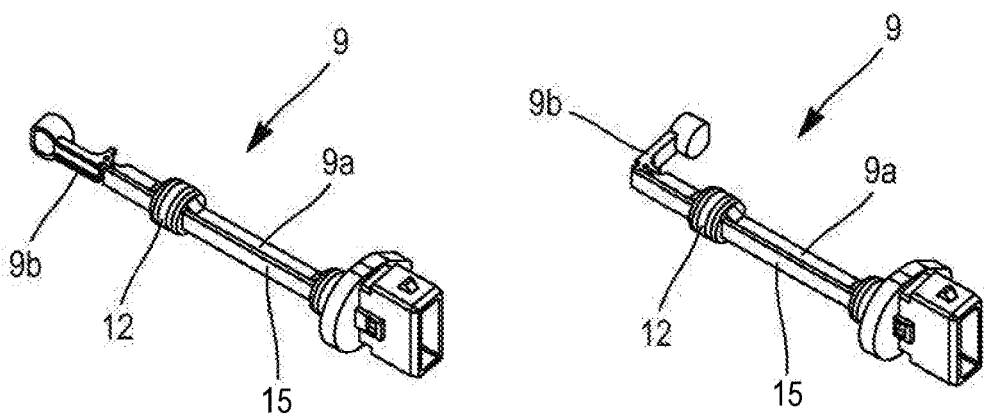
FIG. 4 shows a measuring device with a locking element in the operating position and a control pull tab.

Preferably, and as shown in FIG. 4, the measuring device can be equipped with a wire element, or a pull tab 15, running along or integrated into the measuring device 9, allowing the locking element to be controlled from outside the motor. This makes it easier to mount and/or dismount the measuring device 9, since it is no longer necessary to have direct access to the locking element.

In another embodiment of the present disclosure, shown in FIG. 5, the locking element of the measuring device 9 may include or consist of a return element 14 arranged at the joint between the first part 9a and the second part 9b. This return element 14 naturally tends to place the measuring device 9 in the operating position in the absence of any external force. This may be, for example, a torsion spring.

In this embodiment, shown in FIG. 5, the measuring device 9 is forced into its insertion position until at least part of the first part of measuring device 9 is inserted into the bore of the crankcase to allow it to be inserted. When, by continuing to insert measuring device 9 into the engine block, the second part 9b is fully inserted into the engine block, the return element 14 configures measuring device 9 in its operating position.

Regardless of the method of application chosen, the measuring device 9 can be forcefully pulled out of the bore, for example, for maintenance or servicing purposes, without the need for manually accessing the locking element from inside the engine block. This extraction leads to the natural placement of the first part 9a and the second part 9b of the measuring device in the insertion configuration, by forcing the articulation of the joint between the first part 9a and the second part 9b.

Of course, the present disclosure is not limited to the embodiments described and alternative embodiments can be made without going beyond the scope of the invention as defined by the claims.

The invention claimed is:

1. An internal combustion engine, comprising:
 a cylinder housing defining at least one cylinder and having at least one bore opening under the cylinder;
 a piston disposed in the cylinder and comprising two skirt portions and two reinforcing side walls connecting the two skirt portions to one another;
 a connecting rod having a foot associated with the piston;
 a target arranged on one of the side walls of the piston or on the foot of the connecting rod; and
 a measuring device arranged in the at least one bore of the cylinder housing and comprising a passage sensor for sensing the target, a connector and at least one cable connecting the passage sensor to the connector, a first part of the measuring device supporting the connector, and a second part of the measuring device supporting the passage sensor, the first part and the second part of the measuring device being articulated to one another forming an angle between the first part and the second part, such that the target is arranged opposite the passage sensor when the piston is at or near a bottom dead center position.

2. The internal combustion engine of claim 1, wherein the first part of the measuring device is fully inserted into the cylinder housing.

3. The internal combustion engine of claim 2, wherein the at least one bore is perpendicular to a crankshaft axis of the engine.

4. The internal combustion engine of claim 3, wherein the passage sensor includes a Hall effect sensor.

5. The internal combustion engine of claim 4, wherein the engine has a variable compression ratio.

6. The internal combustion engine of claim 5, wherein the two reinforcing side walls are provided with reinforced bosses for retaining a piston pin, and wherein the target is arranged on one of the reinforced bosses.

7. The internal combustion engine of claim 5, wherein the target is arranged in the vicinity of the foot of the connecting rod.

8. The internal combustion engine of claim 5, wherein the target comprises a magnetic or metallic body.

9. The internal combustion engine of claim 1, wherein the at least one bore is perpendicular to a crankshaft axis of the engine.

10. The internal combustion engine of claim 1, wherein the passage sensor includes a Hall effect sensor.

11. The internal combustion engine of claim 1, wherein the engine has a variable compression ratio.

12. The internal combustion engine of claim 1, wherein the two reinforcing side walls are provided with reinforced bosses for retaining a piston pin, and wherein the target is arranged on one of the reinforced bosses.

13. The internal combustion engine of claim 1, wherein the target is arranged in the vicinity of the foot of the connecting rod.

14. The internal combustion engine of claim 1, wherein the target comprises a magnetic or metallic body.

* * * * *